United States Patent [19]

Daube et al.

[11] Patent Number: 5,283,435
[45] Date of Patent: Feb. 1, 1994

[54] APPARATUS FOR DETERMINING THE CONCENTRATION OF A GAS IN A VACUUM CHAMBER

[75] Inventors: Christoph Daube, Tsubuka, Japan; Alfred Belz, Erlensee; Uwe Kopacz, Hainburg, both of Fed. Rep. of Germany

[73] Assignee: Leybold Aktiengesellschaft, Hanau, Fed. Rep. of Germany

[21] Appl. No.: 881,618

[22] Filed: May 12, 1992

[30] Foreign Application Priority Data

Nov. 27, 1991 [DE] Fed. Rep. of Germany ........ 4138927

[51] Int. Cl.$^5$ .................................... H01L 21/203
[52] U.S. Cl. .................................... 250/289; 250/288; 204/192.13
[58] Field of Search ................ 250/281, 288, 289; 204/192.1, 192.12, 192.13

[56] References Cited

U.S. PATENT DOCUMENTS

| | | | |
|---|---|---|---|
| 4,172,020 | 10/1979 | Tisone et al. | 204/192.13 |
| 4,362,936 | 12/1982 | Hofmann et al. | 250/292 |
| 4,975,168 | 12/1990 | Ohno et al. | 204/192.13 |

FOREIGN PATENT DOCUMENTS

| | | |
|---|---|---|
| 0121019 | 10/1984 | European Pat. Off. |
| 3636127 | 4/1987 | Fed. Rep. of Germany |
| 267264 | 4/1989 | Fed. Rep. of Germany |
| 64-31959 | 2/1989 | Japan ............................. 204/192.13 |

OTHER PUBLICATIONS

JP Patent Abstracts of Japan: 2-47255 A., C-715, May 2, 1990, vol. 14, No. 211.
1-287264 A., C-685, Feb. 6, 1990, vol. 14, No. 63.
1-268859 A., C-679, Jan. 23, 1990, vol. 14, No. 34.
63-83254 A., C-523, Aug. 24, 1988, vol. 12, No. 312.
62-211377 A., C-480, Mar. 9, 1988, vol. 12, No. 75.
62-151562 A., C-464, Dec. 12, 1987, vol. 11, No. 381.

*Primary Examiner*—Jack I. Berman
*Assistant Examiner*—James Beyer
*Attorney, Agent, or Firm*—Felfe & Lynch

[57] ABSTRACT

An apparatus for determining the concentration of a gas in a vacuum chamber is described. Internal to the vacuum chamber are one or more cathodes. The chamber is fed via a gas inlet and is connected to a separate measurement chamber for accommodating a measuring device via a connecting line between the two chambers. The connecting line in conjunction with a pumping means produces a pressure gradient between the interior of the vacuum chamber and the interior of the measurement chamber. One end of the connecting line, located within the vacuum chamber terminates directly in the central region of a cathode surfaces facing the interior of the chamber, and the length, as well as the cross section of the connecting line being dimensioned so that the pressure gradient between the interior of the vacuum chamber and the interior of the measurement chamber, is precisely that required for measurement.

3 Claims, 2 Drawing Sheets

APPARATUS FOR DETERMINING THE CONCENTRATION OF A GAS IN A VACUUM CHAMBER

FIELD OF INVENTION

The invention relates to an apparatus for determining the concentration of a gas in a vacuum chamber.

BACKGROUND OF THE INVENTION

The invention is used for the determination of gas concentration of a gas in chamber, such as a vacuum-coating chamber for a PVD (plasma vapor deposition) method with an arrangement of cathodes in the chamber, a gas inlet into the chamber, a separate measurement chamber for accommodating a measuring device, which preferably is a measuring head of a mass spectrometer, a connecting line between the two chambers with a pressure stage, as well as a pump stand for producing a pressure gradient between the interior of the vacuum chamber and the interior of the measurement chamber.

A method and an apparatus are known for the reactive deposition of a metal compound on a substrate (European patent 0 121 019). For this method, the amount of reactive gas in the chamber is determined by withdrawing the excess reactive gas in the chamber at a place, which is spatially removed from the reaction zone. This publication furthermore describes an apparatus, which contains a mass spectrometer, which generates a control command. An adjustable control circuit is connected to the mass spectrometer in order to generate a specific peak signal from the different signals initially generated by the mass spectrometer.

An apparatus for determining the concentration of a gas in a vacuum chamber is well known in the art. By means of a pressure stage, this apparatus disengages a portion of the gas atmosphere of a vacuum chamber at a pressure of between, for example, $1 \times 10^{-3}$ mbar and $5 \times 10^{-2}$ mbar and generates before the measuring head of a mass spectrometer a pressure preferably of between $1 \times 10^{-5}$ mbar and $5 \times 10^{-4}$ mbar. The pressure stage consists, for example, of an aperture, which is pumped differentially with a separate pumping means.

The reactive gas concentration, which has a critical effect on the coating result of the vacuum deposition process, for example, in the case of a PVD (plasma vapor deposition) method, is that located immediately in front of, or in contact with the target surface. On the other hand, previously known state of the art methods consider only a composition of the gas atmosphere which exists at some distance from the cathode. Due to an inhomogeneous gas distribution at or near the surfaces at which the reaction takes place, the chemical composition at some distance from the cathode can differ substantially from the chemical composition of interest. Furthermore, because of the characteristics of the measuring equipment, a higher proportion of the reactive gas in the atmosphere to be measured would likewise improve the signal-to-noise ratio of the signal at the mass spectrometer.

For these reasons, an atmosphere, which is as close as possible to the cathode surface, should be made available to the mass spectrometer for analysis.

SUMMARY OF THE INVENTION

It is therefore an object of the invention to provide an apparatus for the measurement of gas concentrations in the vicinity of the surface to be coated.

The invention describes an apparatus for determining the concentration of a gas in a first vacuum chamber in the vicinity of one or more cathodes situated within the first vacuum chamber. This apparatus has a gas inlet into the first chamber through which gas is throttled into the chamber; a second chamber for accommodating a measuring device, such as a gas spectrometer; a connecting line between the two chambers; a pumping means connected to the second chamber for producing a pressure gradient between the first vacuum chamber and the second vacuum chamber. One end of the connecting line between the two chambers terminates directly in the central region of one of the cathode surfaces, internally to the first chamber, and the length, as well as the cross section of the connecting line being dimensioned so that the pressure gradient between the interior of the first vacuum chamber and second chamber is precisely what required for a measurement.

Another way of viewing the connecting line is as a pressure stage consisting essentially of the suction line, one end of which terminates in the vacuum chamber directly in the central region of a cathode surface facing the interior of the chamber, where the length, as well as the cross-section of this suction line is dimensioned so that the pressure gradient between the interior of the vacuum chamber and the interior of the measurement chamber, which is required to measure the gas concentration, is precisely that required for a measurement.

With the pressure stage so modified, a higher partial pressure of the reactive gas (such as nitrogen) is achieved in the measurement chamber, in which the mass spectrometer measuring head is mounted, while the total pressure is the same. This means that a better signal-to-noise ratio is advantageously achieved with this measuring arrangement than with the one previously used. Moreover, the composition of the atmosphere corresponds to that present at the end of the suction nozzle (that is, near the center of the cathode). By these means, concentration shifts and changes in the boundary region of the vacuum chamber are advantageously eliminated from the measurement.

These together with other objects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENT

Figure 1:
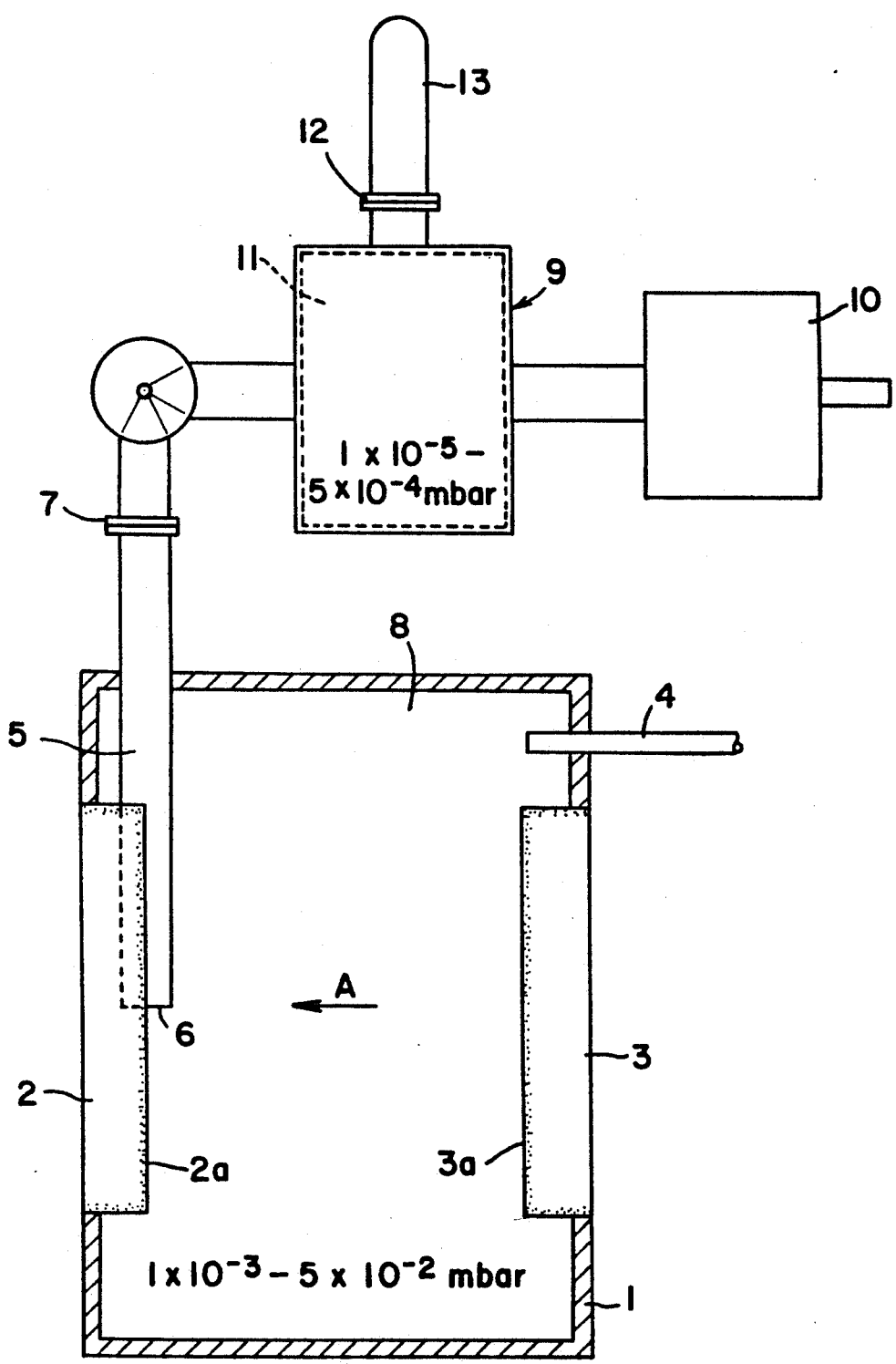
FIG. 1 is an elevational view, partly in section, of a preferred embodiment of this invention.
Figure 2:
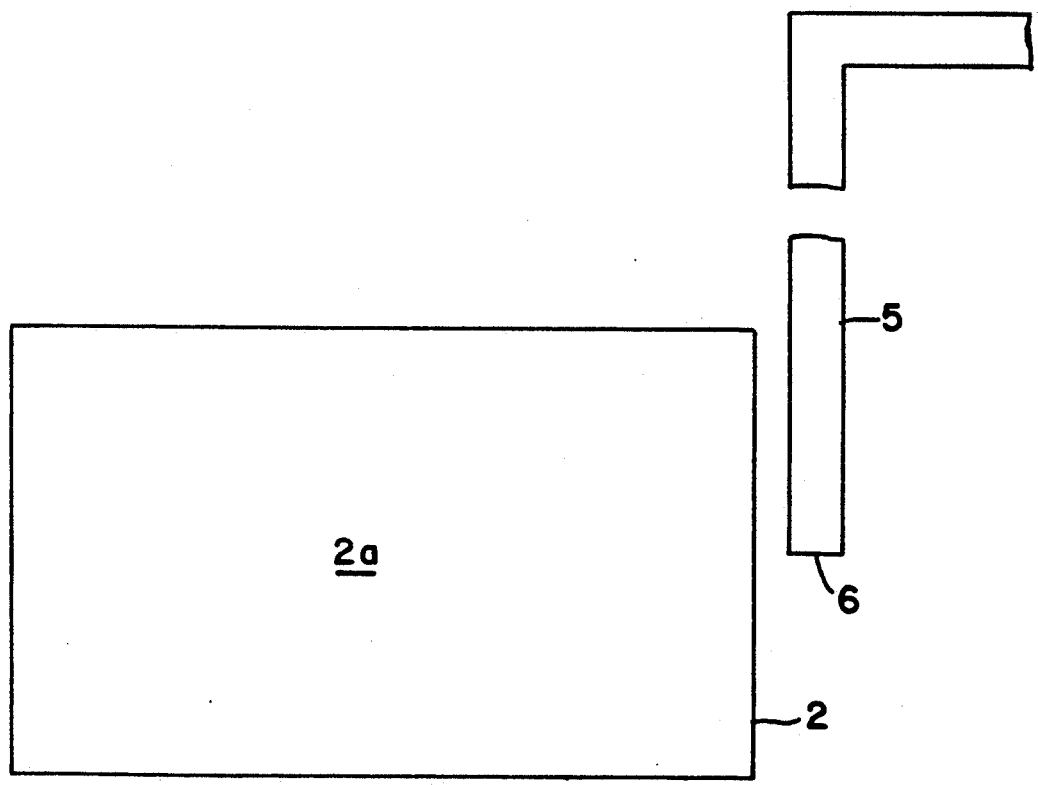
FIG. 2 is a fragmentary, side elevational view of the FIG. 1 embodiment.

The invention permits different possible embodiments. One of these is shown in detail in FIG. 1, which shows a section of a vacuum coating chamber with an inventive measurement apparatus for determining the concentration of the reactive gas in the proximity of a cathode and surface(s) connected thereto.

In the rectangular vacuum coating chamber 1, there are the cathodes 2, 3, as well as a reactive gas inlet 4. The cathodes 2, 3 are disposed in mirror image fashion at the two opposite side walls of the chamber 1. A suction line 5 is attached to the cathode 2, so that the open end 6 of the line terminates about halfway up, and in very close proximity to, the cathode 2. The other end of the line 5 is passed through the casing of the vacuum chamber 1 and ends with a flange 7 outside of the interior 8 of the vacuum chamber 1. At this flange 7, a measurement chamber 9 is connected, which, in turn, is evacuated by way of a separate pump stand 10. The interior 11 of the measurement chamber 9 is connected over a flange connection 12 with a measuring head 13 of a mass spectrometer well known in the art, the details of which are not shown.

The mode of functioning is the following. In the interior 8 of the vacuum chamber 1, there is a pressure of between $1 \times 10^{-3}$ mbar and $5 \times 10^{-2}$ mbar. Such a pressure is necessary, for example, for carrying out a PVD (plasma vapor deposition) method. Through the reactive gas inlet 4, nitrogen, for example, reaches the interior 8 of the chamber 1. Since the coating result is affected decisively by the concentration of the reactive gas which exists in the coating zone directly in front of the target surfaces 2a, 3a and thus in front of the cathodes 2, 3, it is necessary to measure the concentration of the reactive gas at that location. This measurement of the reactive gas is accomplished generally with a mass spectrometer. In order to be able to carry out such a measurement using the mass spectrometer, the pressure at the measuring head 13 of a mass spectrometer must be adjusted to a value between $1 \times 10^{-5}$ mbar and $5 \times 10^{-4}$ mbar. This is accomplished, for example, in a separate measurement chamber 9, which is connected over a suction line 5 with the interior 8 of the vacuum chamber 1. The gas atmosphere directly in front of the cathode 2 can be aspirated by means of this line 5. The length and cross section of this line 5 are selected so that the pressure gradient in front of the measuring head 13 is precisely that required for the measurement. Note that the feed rate from inlet 4 is known, and pump stand, or pumping means 10 rate can also be determined. By choosing the physical dimensions of pipe 6, the desired pressure within chamber 11 can be achieved.

Although the present invention has been shown and described with respect to preferred embodiments, various changes and other modifications which are obvious to persons skilled in the art to which the invention pertains are deemed to lie within the spirit and scope of the invention.

We claim:

1. An apparatus for determining the concentration of a gas in a first chamber, in the vicinity of one or more cathodes each having a central region, said cathodes situated within said first chamber, comprising:
    a gas inlet into said first chamber;
    a second chamber for accommodating a measuring device;
    a connecting line between said two chambers having a first end located within said first chamber and a second end located within said second chamber, a length and a cross-section;
    pumping means connected to said second chamber for producing a pressure gradient between said first chamber and said second chamber, wherein said first end of said connecting line between said two chambers terminates internally to said first chamber adjacent one of said central regions of said cathode surfaces, and said length, and said cross section of said connecting line being so selected that the pressure gradient between the interior of said first vacuum chamber and said second chamber is precisely that required for a measurement.

2. The apparatus of claim 1, wherein a reactive gas is admitted into said first chamber by means of said gas inlet.

3. A method for determining the concentration of a gas in a first chamber in the vicinity of one or more cathodes having a central region, said cathodes situated within said first chamber, comprising the steps of:
    throttling a known rate of gas flow into said first chamber;
    connecting a second chamber for accommodating a measuring device to said first chamber with a connecting line between said two chambers, said line having a length, a cross-section, a first end inside said first chamber and a second end inside said second chamber;
    pumping gas from said second chamber at a known rate of flow for producing a pressure gradient between said first chamber and said second chamber;
    terminating said first end of said line adjacent said central region of one of said cathode surfaces, internally to said first chamber; and
    sizing said length, and said cross-section of said connecting line so that said pressure gradient between said first chamber and said second chamber is of a predetermined value.

* * * * *